United States Patent [19]

Shono et al.

[11] 3,877,060

[45] Apr. 8, 1975

[54] SEMICONDUCTOR DEVICE HAVING AN INSULATING LAYER OF BORON PHOSPHIDE AND METHOD OF MAKING THE SAME

[75] Inventors: Katsufusa Shono, Yokohama; Mitsuharu Takikawa, Shoka, both of Japan

[73] Assignee: Sony Corporation, Tokyo, Japan

[22] Filed: Apr. 17, 1973

[21] Appl. No.: 351,175

[30] Foreign Application Priority Data

Apr. 19, 1972 Japan ............................... 47-38719

[52] U.S. Cl. .................... 357/49; 148/175; 357/16; 357/55; 357/58; 357/60; 357/61

[51] Int. Cl. ....... H01l 19/00; H01l 3/20; H01l 7/36

[58] Field of Search.... 317/235 AC, 235 AS, 235 F; 357/49, 60, 16

[56] References Cited

UNITED STATES PATENTS

| | | | |
|---|---|---|---|
| 3,210,624 | 10/1965 | Williams | 317/235 AC |
| 3,269,878 | 8/1966 | Wenzel et al. | 317/235 AC |
| 3,400,309 | 9/1968 | Doo | 317/235 AC |

*Primary Examiner*—Martin H. Edlow
*Assistant Examiner*—William D. Larkins
*Attorney, Agent, or Firm*—Hill, Gross, Simpson, Van Santen, Steadman, Chiara & Simpson

[57] ABSTRACT

A semiconductor device having an insulating layer made of boron phosphide which is epitaxially deposited on a silicon substrate as a first layer. A silicon layer is epitaxially deposited on the first epitaxial layer as a second layer. In this case, integrated circuits are formed in the second epitaxial layer the electronic elements of which are electrically isolated with one another and the second epitaxial layer is also electrically isolated from the silicon substrate by the first epitaxial layer made of boron phosphide which shows high electrical resistance.

Further, a method of fabricating a semiconductor device having a step of depositing an epitaxial layer of boron phosphide on a silicon substrate.

4 Claims, 5 Drawing Figures

SEMICONDUCTOR DEVICE HAVING AN INSULATING LAYER OF BORON PHOSPHIDE AND METHOD OF MAKING THE SAME

BACKGROUND OF THE INVENTION

1. Field of the Invention

The present invention relates generally to a semiconductor device in which an epitaxial layer made of boron phosphide is used for electrically isolating an epitaxial layer formed thereon, in which integrated circuits are formed. The present invention further relates to a method for fabricating a semiconductor device with an epitaxial layer of boron phosphide.

2. Description of the Prior Art

A so-called monolithic integrated circuit in which a number of electric elements are formed in a single semiconductor substrate has been disclosed in the past. One of the problems of manufacturing a monolithic integrated circuit is how to electrically isolate the elements of the integrated circuit from one another. To this end, a number of techniques have been proposed. However, up to now there has been proposed no technique which may provide a monolithic integrated circuit in which its elements are positively electrically isolated from one another.

Further, there has been proposed a method to positively isolate circuit elements formed in an epitaxial layer from one another, but it requires an expensive sapphire, spinel and the like and it is rather difficult to completely form the epitaxial layer in crystal.

SUMMARY OF THE INVENTION

Accordingly, it is an object of this invention to provide a monolithic integrated circuit in which an epitaxial layer having elements of integrated circuits formed therein is electrically isolated from a semiconductor substrate positively.

It is a further object of this invention to provide an improved monolithic integrated circuit in which the electric elements of integrated circuits formed in an epitaxial layer are electrically isolated by recesses or grooves formed in the epitaxial layer.

It is a further object of this invention to provide a monolithic integrated circuit with a boron phosphide layer of a cubic crystal system, for electrical isolation of an epitaxial layer with integrated circuits formed in said epitaxial layer, the boron phosphide layer being formed in a semiconductor substrate.

It is a yet further object of this invention to provide a monolithic integrated circuit with a boron phosphide layer of a hexagonal crystal system for electrical isolation of an epitaxial layer with integrated circuits formed in said epitaxial layer, the boron phosphide layer being formed on a semiconductor substrate.

It is a still further object of this invention to provide a method of fabricating a semiconductor device with an epitaxial layer made of boron phosphide.

Additional and other objects, features and advantages of the present invention will become apparent from the following description taken in conjunction with the accompanying drawings.

DESCRIPTION OF THE ILLUSTRATED PRIOR ART

Figure 1:
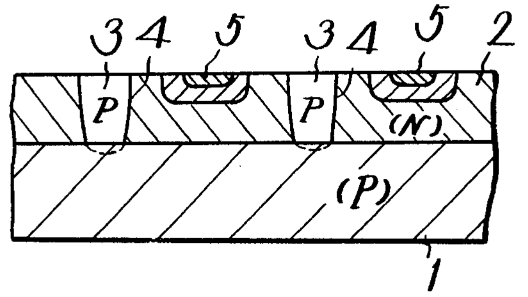
Fig- 1 (PRIOR ART)
FIGS. 1 and 2 are cross-sectional views of semiconductor devices of the prior art, respectively.
Figure 2:
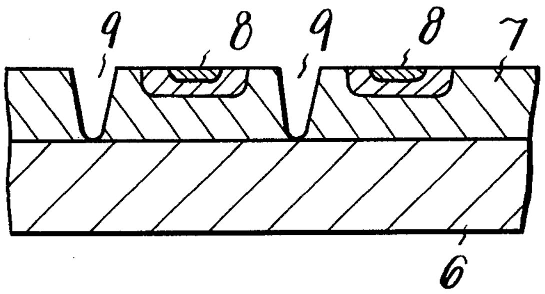
Fig- 2 (PRIOR ART)

In order to facilitate the better understanding of this invention, a description will be now given on conventional semiconductor devices with reference to FIGS. 1 and 2.

In the example of FIG. 1, on a silicon substrate 1 of one conductivity type (for example, P-type conductivity), a silicon epitaxial layer 2 of the other conductivity type (for example, N-type conductivity) is formed. A P-type impurity is diffused in the epitaxial layer 2 from its upper surface in predetermined regions to form P-type regions 3 in the epitaxial layer 2. In this case, the P-type regions 3 are formed to arrive at or penetrate into the substrate 1 and are used as isolation regions. That is to say, PN-junctions 4, formed between the N-type epitaxial layer 2 and the P-type regions 3, are reversely biased to electrically isolate elements formed in separated regions of the epitaxial layer 2 by the regions 3. In the figure, reference numerals 5 designate circuit elements formed in the separated regions of the layer 2 by the isolation regions 3 according to the known planar techniques.

The semiconductor device shown in FIG. 1 has a defect that a parasitic capacity is established between the circuit element 5 and the substrate 1 and a leakage current may flow through the isolation regions 3. In other words, the circuit elements 5 can not be electrically and positively isolated.

In the device shown in FIG. 2, an insulating substrate 6, which is similar to the substrate 1 of FIG. 1 in crystal structure, is employed in place of the substrate 1. A semiconductor epitaxial layer 7 is formed on the substrate 6 and the circuit elements 8 are then formed in the epitaxial layer 7. Sapphire, spinel and the like are used as the insulating substrate 6 in the prior art, while silicon is employed as material for the epitaxial layer 7. In this example, grooves 9 are formed in the epitaxial layer 7 by etching process to electrically isolate the circuit elements 8. In this case, the grooves 9 are formed to arrive at the substrate 6.

The device shown in FIG. 2 is high in electrical isolation, but expensive because it uses sapphire, spinel and the like.

Further, the epitaxial layer used in this device could not be made perfectly from crystal point of view.

DESCRIPTION OF A PREFERRED EMBODIMENT

A semiconductor device of this invention, free from the drawbacks encountered in the prior art, will be now described. In this invention a semiconductor substrate such, for example, as a silicon single crystal substrate is prepared and a first epitaxial layer, whose material is, for example, boron phosphide with an energy gap wider than that of the material for the above mentioned semiconductor substrate, is formed on the semiconductor substrate. Thereafter, a second epitaxial layer, whose material is substantially the same as that of the semiconductor substrate, is formed on the first epitaxial layer.

The first epitaxial layer is formed as a boron phosphide layer and is 2eV in the energy gap of the forbidden gap. This is relatively high, and hence exhibits high resistance when it is used as an intrinsic semiconductor with no impurity doping, and hence, it can be used as an electrical isolation layer between the second epitaxial layer and the substrate. Electric circuit elements are formed in the second epitaxial layer. The circuit elements formed in the second epitaxial layer are electrically isolated from one another therein by the provisions of grooves which pass through the second epitaxial layer and extend to the first epitaxial layer.

The boron phosphide may have a crystal structure of a cubic crystal system or a hexagonal crystal system and its crystal structure and lattice spacing are similar to those of silicon. Accordingly, the epitaxial growth of boron phosphide can be easily carried out on silicon and vice versa. It may be noted that the lattice spacing of crystal silicon is $a = 5.43$A, the lattice spacing of crystal boron phosphide is $a = 4.53$A in cubic crystal system but 6.19A in a hexagonal crystal system.

In order to form the first epitaxial layer of boron phosphide and to improve the crystal nature of the second epitaxial layer formed on the first epitaxial layer, it is desirable to select the material of the second epitaxial layer to be the same as that of the substrate.

Due to the fact that the boron phosphide shows high resistivity in its intrinsic state, the boron phosphide can act as an insulating layer even if it is made very thin. The resistivity of the boron phosphide can be made in the order of $10^6$ Ωcm. in its state because the forbidden gap of the boron phosphide is more than 2eV which is wider than that 1.1eV of silicon, and there is almost no impurity doping into the boron phosphide. For epitaxial growth of material such as boron phosphide with a large forbidden gap on a semiconductor substrate, the thermal decomposition or pyrolysis of diborane ($B_2H_6$) and phosphine ($PH_3$) is utilized, while for the epitaxial growth of silicon thereon, thermal decomposition of silane $SiH_4$) is employed. As a doping gas for impurity, arsine ($AsH_3$), phosphine ($PH_3$), diborane ($B_2H_6$), or the like, is added in accordance with necessity. The resistivity of silicon can be controlled to be within about $10^{-3}$ to $10^{-2}$ Ωcm. in case of P-type and N-type, if necessary.

Figure 4:
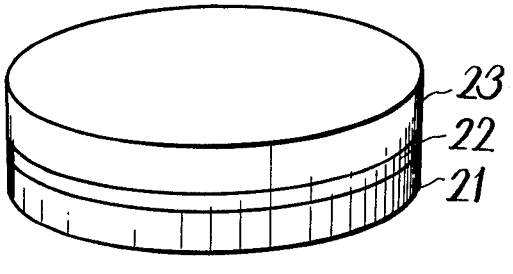
FIG. 4 is a perspective view of a semiconductor device according to this invention.
Figure 3:
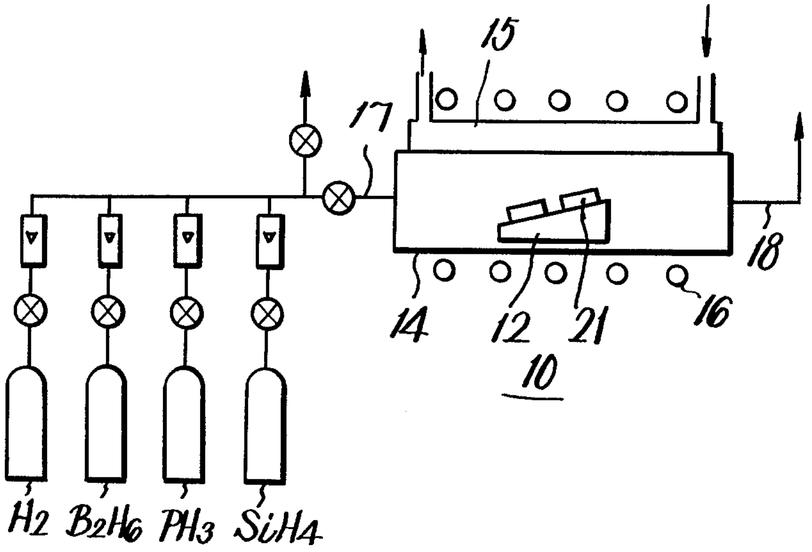
FIG. 3 is a schematic diagram illustrating a reaction device used for manufacturing a semiconductor device according to this invention.

With reference to FIGS. 3 and 4, some examples of this invention will be hereinbelow described for better understanding of this invention.

EXAMPLE I

A silicon monocrystal is used as a semiconductor substrate 21. In this example, a silicon base plate (substrate) with the face (100) or (111) is used as a starting material. The substrate is made to have thickness of 200 microns, doped with N-type impurity and has a resistivity of 10 Ωcm.

The substrate is polished as a mirror surface and then is rinsed with acetone, trichloroethylene, nitric acid, sulfuric acid and hydrogen fluoride in this order. The thus treated silicon monocrystal substrate 21 is disposed in a reaction device 10 which may be used for carrying out epitaxial growth. A reactor core tube 14 of the reaction device 10 is made of quartz to have the dimension of 25 mm in height, 35 mm in lateral width and about 400 mm in length with rectangular shape in cross-section. The reactor core tube 14 is cooled on its upper surface by water flowing through a cooling passage 15 disposed on the upper surface of the core tube 14. A heating coil 16 is wound around the core tube 14 and the passage 15 to heat the inside of the reactor core 14 with high frequency. The silicon monocrystal substrate 21, on which an epitaxial growth is carried out, is placed on a suscepter 12 which is disposed in the reactor core tube 14. The suscepter 12 is made of graphite covered with SiC and is heated by high frequency to heat the silicon monocrystal substrate 21 thereon to a desired temperature, for example, 900° C. When boron phosphide is subjected to an epitaxial growth process at a temperature of about 900° C, it becomes a crystal of a face centered cubic lattice system.

A mixture of compound gas and carrier gas is fed to the reactor core tube 14 of the reaction device 10 through an inlet 17 thereof for the epitaxial growth. The mixture gas introduced into the tube 14 is released from an outlet 18 to the outside of the tube 14 after passing through the substrate 21.

In this example, hydrogen is flowed at the flow rate of 5 liters/min. as the carrier gas, while 0.01% of diborane and 0.02% of phosphide are added to the carrier gas as the reaction gas. The growing speed of an epitaxial layer is selected to be 0.3 micron/min., and this growth is maintained for five minutes. As a result, a first epitaxial layer 22 of boron phosphide (BP) with a cubic crystal system is formed or deposited on the substrate 21 as shown in FIG. 4. In this case, it is ascertained that the resistivity of the first epitaxial layer 22 is $10^4$ Ωcm. On the first epitaxial layer 22, there is formed or deposited a second epitaxial layer 23 of silicon at a temperature of 1,100° C by an ordinary manner, as shown in FIG. 4. The thickness of the second epitaxial layer 23 is selected to be from 1.5 to 5 microns. Arsenic (As) is doped into the second epitaxial layer 23 so that its resistivity is 1–2 Ωcm.

The relationship between the orientations of the crystals of thus formed epitaxial layers is as follows. When the silicon substrate 21 with the face (100) is employed, the boron phosphide layer 22 with the face (110) is epitaxially formed thereon, and the silicon layer 23 with the face (100) is epitaxially formed on the first epitaxial layer. While, when the silicon substrate 21 with the face (111) is employed, the boron phosphide layer 22 with the face (311) is epitaxially formed, and the silicon layer 23 with the face (111) is epitaxially formed on the first epitaxial layer 22. The lattice constant $a$ of boron phosphide in cubic crystal system is 4.53A ($a = 4.53$A) and its forbidden gap is 2.0eV.

EXAMPLE II

A reaction device used for achieving epitaxial growth in this example is substantially the same as that used in the Example I, so that its description is omitted for the sake of brevity.

In general, when boron phosphide is subjected to an epitaxial grown process at 1,100° C., it becomes a crystal of hexagonal crystal system. In this example, the silicon monocrystal substrate 21 with the face (111) or (100) is used as a starting material. In this case, the silicon monocrystal substrate 21 is formed to be 200 microns in thickness and to have the resistivity of 10 Ωcm., with N-type impurity doped thereinto. Hydrogen is flowed into the reactor core tube 14 at the flow rate of 5 liters/min. as a carrier gas, and 0.004% of diborane and 0.002% of phosphine are added to the carrier gas as a reaction gas. In this case, the speed of the epitaxial layer is selected to be 0.1 micron/min., and the epitaxial growth is kept for about 8 minutes. As a result, the first epitaxial layer 22 of boron phosphide is formed in hexagonal crystal system. It is ascertained that the resistivity of the thus formed first epitaxial layer is $10^5$–$10^6$ Ωcm. On the first epitaxial layer 22, a second epitaxial layer 23 is formed at 1,100° C. with thickness of 1.5–5 microns in an ordinary manner. To this second epitaxial layer 23, arsenic (As) is doped so that the resistivity thereof is made to be 0.4–0.8 Ωcm. in N-type.

The relationship between the orientation of the crystals of the first and second epitaxial layers in this example is as follows. On the silicon substrate 21 with the face of (111) and the direction of [110], the boron phosphide layer 22 is epitaxially grown with the face of $(10\bar{1}0)$ and the direction of [0001], while on the silicon substrate with the face of (100) and the direction of [100] the boron phosphide layer 22 is epitaxially grown with the face of $(11\bar{2}0)$ and the direction $[1\bar{1}0\bar{1}]$. The orientation or face and direction of the silicon second epitaxial layer 23 are substantially the same as those of the substrate 21.

The lattice constant of the boron phosphide in the hexagonal crystal system is $a = 6.19$A and $c = 12.25$A and its forbidden gap is 6eV. 21,

Semiconductor devices manufactured as mentioned above may be used to fabricate integrated circuit devices. For example, semiconductor elements such as diodes, transistors, resistors, capacitors and the like are formed in the second epitaxial layer 23 and the silicon substrate 21, if necessary, by diffusion techniques. In this case, the conductivity type of the second epitaxial layer 23 made of silicon, may be selected in accordance with necessity.

It is also possible to form a number of epitaxial layers of silicon and boron phosphide.

The semiconductor elements formed in the second epitaxial layer 23 of silicon may be electrically isolated from one another by an ordinary etching technique. A mixed solution of nitric acid, hydrogen fluoride and acetic acid at the ratio of 6:1:2 is used as an etchant for the silicon. Since boron phosphide is hard and hence hardly etched, selective etching process for electrically isolating the semiconductor elements from one another is stopped when the etchant arrives at the first epitaxial layer 22 of boron phosphide. It is possible to inject a suitable insulating material, such as resin, into grooves formed by this etching.

Figure 5:
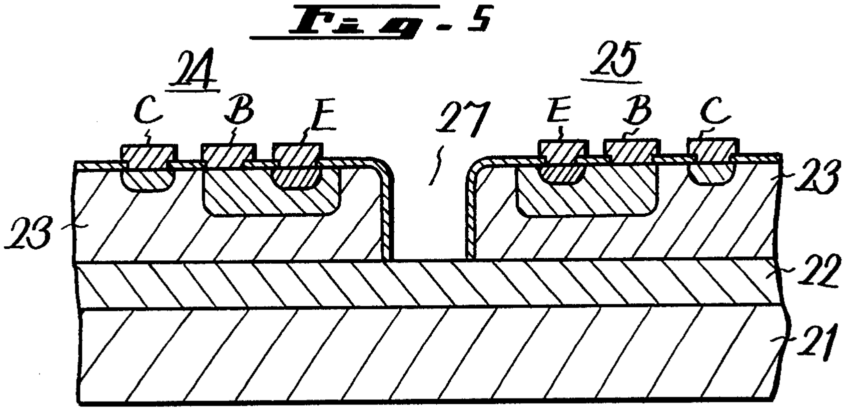
FIG. 5 is an enlarged cross-sectional view of a part of the semiconductor device shown in FIG. 4.

With reference to FIG. 5, an example of an integrated circuit according to this invention will be now described, in which reference numerals similar to those of the foregoing show similar elements. In order to simplify the description, two bipolar transistors and an electrical isolation portion therebetween are only illustrated in FIG. 5. In this example, the second epitaxial layer 23 of silicon is electrically isolated from the silicon substrate 21 by the first epitaxial layer 22 of boron phosphide. The second epitaxial layer 23 of silicon is made to be N-type in this example, and two bipolar transistors 24 and 25 are formed in the second epitaxial layer 23. Each of the bipolar transistors 24 and 25 has a P-type base electrode B and an N-type emitter electrode E formed by diffusion. The two bipolar transistors 24 and 25 are electrically isolated from each other by a groove 27 which is formed by etching process.

The boron phosphide has a characteristic of light-permeability, so that it is possible for a diode array to be formed in the silicon epitaxial layer 23, and it may thus be used as a photoelectric target. In FIG. 5, reference characters C designate collector electrodes of the transistors 24 and 25, which are the same as that of the second epitaxial layer 23 in material and reference numeral 26 designates a protective layer for exposed surface of the second epitaxial layer 23 made of $SiO_2$.

It will be well understood that many variations and modifications could be effected without departing from the spirit and scope of the novel concepts of the present invention.

We claim as our invention:

1. A semiconductor device comprising: a monocrystalline silicon substrate; a first epitaxial layer of undoped boron phosphide on one surface of said substrate and having a resistivity greater than $10^4$ ohms-cm; and a second epitaxial layer of silicon on said first epitaxial layer, said boron phosphide layer having a hexagonal lattice structure and said boron phosphide layer serving as an isolation non-electrical conducting area.

2. A semiconductor device as set forth in claim 1, in which the relationship between the orientation of the crystals of said first and second layers is that when the substrate has a (111) face and the direction [110], said boron phosphide layer has a (1010) face and the direction [0001].

3. A semiconductor device as set forth in claim 1, in which the relationship between the orientation of the crystals of said first and second layers is that when the substrate has a (100) face and the direction [100], said first layer has a $(11\bar{2}0)$ face and the direction $[1\bar{1}0\bar{1}]$.

4. A semiconductor device as set forth in claim 1, in which the boron phosphide of said first epitaxial layer has a lattice constant $a$ of 6.19A and a constant $c$ of 12.25A and a forbidden gap of 6eV.

* * * * *